US008324072B2

(12) United States Patent
Veytizou et al.

(10) Patent No.: US 8,324,072 B2
(45) Date of Patent: Dec. 4, 2012

(54) PROCESS FOR LOCALLY DISSOLVING THE OXIDE LAYER IN A SEMICONDUCTOR-ON-INSULATOR TYPE STRUCTURE

(75) Inventors: Christelle Veytizou, Bernin (FR); Fabrice Gritti, Voiron (FR); Eric Guiot, Goncelin (FR); Oleg Kononchuk, Grenoble (FR); Didier Landru, Champ Pres Froges (FR)

(73) Assignee: Soitec, Bernin (FR)

( * ) Notice: Subject to any disclaimer, the term of this patent is extended or adjusted under 35 U.S.C. 154(b) by 0 days.

(21) Appl. No.: 13/062,996

(22) PCT Filed: Sep. 21, 2009
(Under 37 CFR 1.47)

(86) PCT No.: PCT/EP2009/062219
§ 371 (c)(1),
(2), (4) Date: Jun. 6, 2011

(87) PCT Pub. No.: WO2010/034696
PCT Pub. Date: Apr. 1, 2010

(65) Prior Publication Data
US 2012/0094496 A1 Apr. 19, 2012

(30) Foreign Application Priority Data
Sep. 23, 2008 (FR) ..................................... 08 56383

(51) Int. Cl.
*H01L 21/76* (2006.01)

(52) U.S. Cl. ................................ 438/405; 257/E21.561

(58) Field of Classification Search .................. 438/402, 438/405, 439; 257/E21.561
See application file for complete search history.

(56) References Cited

U.S. PATENT DOCUMENTS

| | | | | |
|---|---|---|---|---|
| 6,300,218 | B1 | 10/2001 | Cohen et al. | 438/423 |
| 6,350,659 | B1 * | 2/2002 | Liu et al. | 438/424 |

(Continued)

FOREIGN PATENT DOCUMENTS

| | | |
|---|---|---|
| FR | 2 910 702 A1 | 6/2008 |
| JP | 2006-49725 | 2/2006 |
| JP | 2008-159811 | 7/2008 |

OTHER PUBLICATIONS

B. Johnson et al., "Evolution of microstructure during annealing of low-dose SMIX wafers implanted at 65keV", Journal of Materials Science, Materials in Electronics vol. 13, 2002, pp. 303-308.*

(Continued)

*Primary Examiner* — William D Coleman
(74) *Attorney, Agent, or Firm* — Winston & Strawn LLP

(57) ABSTRACT

A process for treating a semiconductor-on-insulator type structure that includes, successively, a support substrate, an oxide layer and a thin semiconductor layer. The process includes formation of a silicon nitride or silicon oxynitride mask on the thin semiconductor layer to define exposed areas at the surface of the layer which are not covered by the mask, and which are arranged in a desired pattern; and application of a heat treatment in a neutral or controlled reducing atmosphere and under controlled conditions of temperature and time to induce at least a portion of the oxygen of the oxide layer to diffuse through the thin semiconductor layer, thereby resulting in the controlled reduction in the oxide thickness in the areas of the oxide layer corresponding to the desired pattern. The mask is formed so as to be at least partially buried in the thickness of the thin semiconductor layer.

14 Claims, 6 Drawing Sheets

U.S. PATENT DOCUMENTS

| | | | | |
|---|---|---|---|---|
| 2008/0057673 | A1 * | 3/2008 | Chen et al. | 438/439 |
| 2008/0153251 | A1 | 6/2008 | Kostrzewa et al. | 438/406 |
| 2008/0153257 | A1 | 6/2008 | Kononchuk | 438/455 |
| 2010/0193899 | A1 * | 8/2010 | Kononchuk | 257/506 |
| 2011/0275226 | A1 * | 11/2011 | Landru et al. | 438/778 |
| 2012/0190170 | A1 * | 7/2012 | Kononchuk | 438/439 |

OTHER PUBLICATIONS

De Veirman et al., "Study of high dose oxygen implanted and annealed silicon wafers by electron microscopy", Institute of Physics Conference, Microsc. Semicond. Mater. Conf. Oxford, England, Apr. 6-8, 1987, pp. 403-408.*

International Search Report, PCT/EP2009/062219, mailed Nov. 23, 2009.

Ludsteck, A. et al., "Growth Model for Thin Oxides and Oxide Optimization", Journal of Applied Physics, vol. 95, No. 5, pp. 2827-2831 (2004).

Zhong, L. et al. "Determination of Silicon Evaporation Rate at 1200° C. in Hydrogen", Appl. Phys. Lett., vol. 67, No. 26, pp. 3951-3953 (1995).

* cited by examiner

PROCESS FOR LOCALLY DISSOLVING THE OXIDE LAYER IN A SEMICONDUCTOR-ON-INSULATOR TYPE STRUCTURE

This application is a 371 filing of International Patent Application PCT/EP2009/062219 filed Sep. 21, 2009.

FIELD OF THE INVENTION

This invention relates to a process for treating a semiconductor-on-insulator (SeOI) type structure successively comprising a support substrate, an oxide layer and a thin semiconductor layer, in which a heat treatment is applied in a neutral or controlled reducing atmosphere, and under controlled conditions of temperature and time, so as to induce at least a portion of the oxygen of the oxide layer to diffuse through the thin semiconductor layer, which results in the complete or partial dissolution of the oxide layer.

BACKGROUND OF THE INVENTION

The above-mentioned treatment can advantageously be applied locally, i.e., in order to partially or completely dissolve the oxide layer in specific regions of the SeOI structure, which correspond to a desired pattern, while at the same time preserving the oxide layer in the other regions of the initial oxide layer.

Reference is then made to a “local dissolution” of the oxide layer.

An SeOI structure can thus be obtained having an oxide layer with varying thicknesses (in the case of partial dissolution), or else a hybrid structure, i.e., comprising both “SeOI” areas, in which the oxide layer has been preserved, and “bulk” layers, in which the oxide layer has been completely dissolved.

Such a structure can be used for the manufacture of different types of electronic components (e.g., “memory” components and logic components), which are normally manufactured on different supports.

As a matter of fact, the manufacturers of microprocessors have each developed technologies for manufacturing logic and memory components, however these two types of components are generally manufactured on different respective supports (i.e., a bulk or else an SeOI substrate).

In addition, shifting from one type of support to the other involves significant changes in manufacturing technology.

Therefore, the desirability of local dissolution lies in providing a microprocessor manufacturer with a plate comprising “bulk” and “SeOI” areas on which they will be able to manufacture both “logic” and “memory” components, while at the same maintaining the technologies in which they are skilled.

The precision of the local dissolution technique does indeed enable the “bulk” and “SeOI” areas of the components to be controlled.

Local dissolution can be implemented by forming a mask at the surface of the thin semiconductor layer, and by applying the heat treatment promoting oxygen diffusion.

Since the mask is made in a material forming an oxygen diffusion barrier, the oxygen can only diffuse through the exposed areas of the thin semiconductor layer, i.e., the areas that are not covered by the mask.

However, the disappearance of the oxygen atoms beneath the semiconductor layer results in a subsiding of the surface of the semiconductor layer.

Thus, in the case where the thin semiconductor layer is made of silicon, the following two phenomena are observed during the dissolution treatment:

- on the one hand, the disappearance of the oxygen from the oxide layer, which is due to the diffusion of the atoms through the thin semiconductor layer; this phenomenon contributes to a subsidence of approximately half the thickness of the oxide layer. This value is associated with the existing ratio of 0.46 between the volume of the Si and the volume of the $SiO_2$;
- on the other hand, the disappearance of silicon from the surface of the thin semiconductor layer, which is due to the incorporation of highly volatile SiO complexes into the dissolution treatment atmosphere. This phenomenon contributes to a subsidence of the thickness of the oxide layer. As a matter of fact, a pair of $O_2$ atoms causes the disappearance of two Si atoms.

In all, the combination of these two phenomena results in a subsidence of the order of 1.5 times the thickness of the oxide layer.

The non-planarity of the surface of the semiconductor layer is detrimental to the subsequent formation of components.

This topography can be observed in FIG. 1, which shows a structure resulting from a local dissolution treatment.

This structure includes a substrate 1, an oxide layer 2, which has been dissolved in one region 2*a*, and a thin semiconductor layer 3, which is covered in places by a mask 4.

In the exposed area 3*a* of the semiconductor layer, the free surface has a difference in level in relation to the upper surface of the areas covered by the mask 4.

These topographical defects are detrimental to the manufacture of components on the thin semiconductor layer 3.

To that end, after deposition of the mask, document JP 2006-49725 anticipates carrying out a step for silicon epitaxy on the silicon surface not covered by the mask.

This additional thickness of silicon in the exposed areas compensates for the subsidence due to the dissolution of the oxide.

However, this step proves to be costly and has a negative impact on the treatment process.

In addition, it is difficult to anticipate mechanical-chemical type polishing aiming to planarize the surface in order to prevent the differences in level associated with the subsidence of the semiconductor layer, because this would remove a considerable degree of thickness of the semiconductor layer, the initial thickness of this layer being chosen to be thin in order to facilitate diffusion of the oxygen.

Furthermore, polishing tends to damage the uniformity of thickness of the semiconductor layer.

In addition, such polishing would risk polluting the surface of the thin layer, which is sought to be avoided when manufacturing electronic components.

Therefore, one of the objectives of the invention is to define a more economical and easy to implement process, thereby making it possible to minimize the subsidence of the surface of the semiconductor layer, so that, upon conclusion of the treatment, the smoothest possible surface is obtained.

SUMMARY OF THE INVENTION

The invention relates to a process for treating a semiconductor-on-insulator type structure, successively comprising a support substrate, an oxide layer and a thin semiconductor layer, said process comprising the following steps:

a) formation of a silicon nitride or silicon oxinitride mask on the thin semiconductor layer, so as to define so-called exposed areas at the surface of said layer, which are not covered by the mask, and which are arranged in a desired pattern, b) application of a heat treatment in a neutral or controlled reducing atmosphere, and under controlled conditions of temperature and time, so as to induce at least a portion of the oxygen of the oxide layer to diffuse through the thin semiconductor layer, thereby resulting in the controlled reduction in the oxide thickness in the areas of the oxide layer corresponding to said desired pattern.

This process is remarkable in that, in step (a), the mask is formed so as to at least partially bury same in the thickness of the thin semiconductor layer. In this text, "at least partially bury" is understood to mean that the mask is at least partially formed in the thickness of the semiconductor layer. For any layer comprising the structure, the face of the layer closest to the support substrate is defined as the "base", and the face opposite the base is defined as the "upper face".

In general, in step (a) the formation of the mask involves the consumption of at least a portion of the thickness of said semiconductor layer in the areas complementary to the exposed areas.

By "consumption" is meant in the present text either the disappearance (by etching for example) or the transformation (in another material) of at least a portion of the semiconductor layer in the considered area.

According to a first embodiment of the invention, the mask is formed by nitriding the material of the semiconductor layer, which results in a portion of the thickness of the semiconductor layer being consumed.

In this case, the thickness of the portion of the mask contained between the base of the mask and the free surface of the exposed areas of the semiconductor layer is chosen to be substantially equal to 1.5 times the thickness of the oxide layer of the structure.

The thickness of the mask is preferably between 1 and 50 nm, and the nitriding step is carried out by annealing the structure in a nitrogen atmosphere at a temperature of between 700 and 1,000° C.

As an alternative to nitriding, the mask is formed by implanting nitrogen at the surface of the semiconductor layer.

According to a second embodiment, step (a) includes the following steps:

(i) etching of the thin semiconductor layer so as to form trenches at the locations anticipated for the mask;

(ii) formation of the mask in said trenches.

The trenches formed in step (i) preferably have a depth substantially equal to 1.5 times the thickness of the oxide layer of the structure.

In a particularly advantageously manner, the mask is formed such that the upper surface thereof is flush with the upper surface of the exposed areas of the semiconductor layer.

The thickness of the mask is preferably between 1 and 50 nm, and step (ii) includes nitriding of the trenches or implantation of nitrogen at the surface of the semiconductor material of the trenches.

According to an alternative, the mask-formation step (ii) includes the following steps;

- deposition of silicon nitride on the structure obtained in step (i), over a thickness greater than the depth of the trenches;
- planarization of the silicon nitride deposited in the preceding step, until reaching the exposed areas of the semiconductor layer.

In a particularly advantageous manner, the semiconductor layer is made of silicon and has a thickness smaller than 5,000 Å, and preferably smaller than 2,500 Å.

BRIEF DESCRIPTION OF THE FIGURES

Other effects and advantages of the invention will be better understood upon reading the following detailed description, with reference to the appended figures, in which.

DETAILED DESCRIPTION OF THE INVENTION

Figure 1:
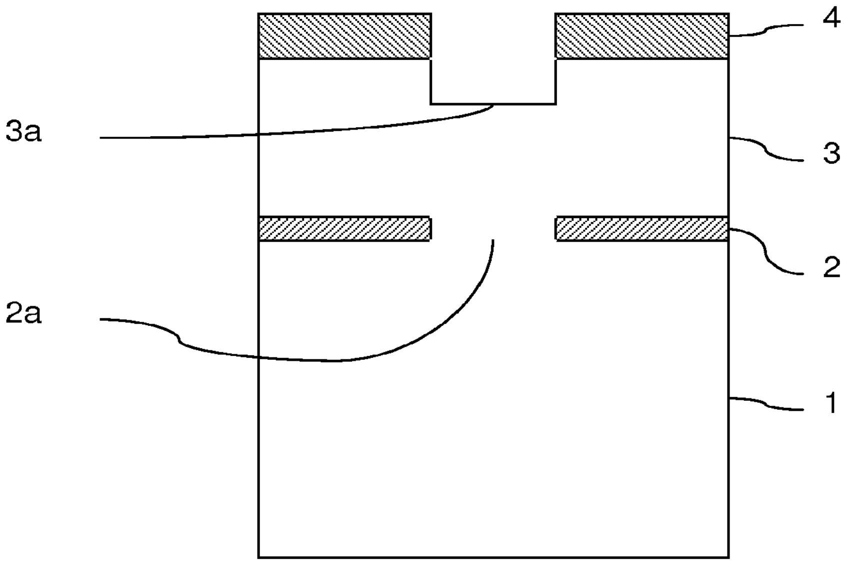
FIG. 1 shows a semiconductor-on-insulator type structure following a localized oxide dissolution treatment in accordance with the prior art.

The local dissolution treatment is applied to a semiconductor-on-insulator (SeOI) type structure which, from the base to the surface thereof, comprises a support substrate, an oxide layer and a semiconductor layer.

The means of obtaining said SeOI structure will be described in detail below.

The local dissolution process includes the following steps:

a) formation of a mask on the thin semiconductor layer, so as to define so-called exposed areas at the surface of said layer, which are not covered by the mask, and which are arranged in a desired pattern, b) application of a heat treatment in a neutral or controlled reducing atmosphere, and under controlled conditions of temperature and time, so as to induce at least a portion of the oxygen of the oxide layer to diffuse through the thin semiconductor layer, thereby resulting in the controlled reduction in the oxide thickness in the areas of the oxide layer corresponding to said desired pattern.

Formation of the Initial SeOI Structure

The dissolution treatment is applied to a semiconductor-on-insulator (SeOI) structure which, from the base to the support substrate thereof, successively comprises an oxide layer and a semiconductor layer.

The support substrate acts substantially as stiffener for the SeOI structure.

To that end, it typically has a thickness of the order of a few hundreds of micrometres.

The support substrate can be a bulk or else composite substrate, i.e., consisting of a stack of at least two layers of different materials.

The support substrate can thus include one of the following materials: Si, GaN or sapphire, in the monocrystalline or polycrystalline forms thereof.

The semiconductor layer includes at least one semiconductor material, such as Si, Ge or SiGe.

The semiconductor layer may optionally be composite, i.e., consisting of a stack of semiconductor material layers.

The material of the semiconductor layer can be monocrystalline, polycrystalline or amorphous. It can be porous or non-porous, doped or undoped.

In a particularly advantageous manner, the semiconductor layer is designed to receive electronic components.

The thin semiconductor layer has a thickness of less than 5,000 Å, and preferably less than 2,500 Å, in order to enable sufficiently rapid diffusion of the oxygen. As a matter of fact, the slower the dissolution rate of the oxide, the thicker the semiconductor layer.

In this way, the diffusion of oxygen through a semiconductor layer having a thickness greater than 5,000 Å is very slow and, for this reason, industrially disadvantageous.

The oxide layer is buried in the structure, between the support substrate and the semiconductor layer; therefore, in the language of the art, it is generally designated by the acronym BOX ("Buried Oxide Layer").

The SeOI structure is manufactured by any layer transfer technique known to those skilled in the art which involves bonding.

Among these techniques, reference may be made to the SmartCut™ process, which primarily includes the following steps:

(i) formation of an oxide layer on the support substrate or on a donor substrate comprising the semiconductor layer, (ii) formation of an embrittlement area in the donor substrate, the embrittlement area defining the thin semiconductor layer to be transferred, (iii) bonding of the donor substrate to the support substrate, the oxide layer being situated at the bonding interface, (iv) fracturing of the donor substrate along the embrittlement area in order to transfer the thin semiconductor material to the support substrate.

This process is known by those skilled in the art and therefore will not be described in detail here. For example, reference may be made to "Silicon-On-Insulator Technology: Materials to VLSI, 2nd Edition" by Jean-Pierre Colinge, Kluwer Academic Publishers, pages 50-51.

It is likewise possible to use a process which consists in bonding a donor substrate comprising the semiconductor layer onto the support substrate, one or both of the substrates being covered with an oxide layer, and in then reducing the thickness of the donor substrate via the rear face thereof, so as to leave only the thin semiconductor layer on the support substrate.

The resulting SeOI structure can next be subjected to conventional finishing treatments (polishing, planarization, cleaning . . . ).

In these processes for forming the SeOI structure, the oxide layer is formed on the donor substrate or on the support substrate via thermal oxidation (in which case the oxide is an oxide of the material of the substrate having undergone oxidation) or else via deposition of silicon oxide ($SiO_2$), for example.

The oxide layer can likewise be a layer of native oxide resulting from natural oxidation of the donor substrate and/or support substrate in contact with the atmosphere.

On the other hand, tests conducted on the SOI structures obtained via the SIMOX process did not enable observation of oxide dissolution, which was attributed to a lower-quality oxide, due to the method of obtainment thereof. In this regard, reference may be made to the article by L. Zhong et al, "Applied Physics Letters 67" 3951 (1995).

Prior to bonding, it is specified that cleaning or plasma activation steps well-known to those skilled in the art can be implemented on one or both of the contacting surfaces, so as to increase the bonding energy.

In order to limit the duration of the dissolution treatment, the oxide layer of the SeOI structure generally has a fine or ultrafine thickness, i.e., between 50 and 1,000 Å, and preferably between 100 and 250 Å.

Dissolution Treatment

Throughout the remainder of the description, the example taken shall be that of the application of the dissolution treatment to a structure in which the thin semiconductor layer is made of silicon, i.e., a "Silicon-On-Insulator" (SOI) structure.

The mechanisms for dissolving the oxide in an SOI structure are described in detail in the article by O. Kononchuk et al, <<Internal Dissolution of Buried Oxide in SOI Wafers>>, Solid State Phenomena Vols. 131-133 (2008) pp. 113-118, to which reference may be made.

During the treatment, the SOI structure is placed in an oven in which a gas stream is generated in order to form a neutral or reducing atmosphere.

The gas stream can thus include argon, hydrogen and/or a mixture thereof.

It is important to note that the dissolution phenomenon only occurs when a sufficient gradient exists between the concentration of oxygen in the atmosphere and the concentration of oxygen at the surface of the oxide layer.

Thus, it is determined that the oxygen content of the atmosphere in the oven should be less than 10 ppm, which, taking account of leaks, requires an oxygen content in the gas stream of less than 1 ppm.

In this regard, reference may be made to the article by Ludsteck et al, <<Growth model for thin oxides and oxide optimization>>, Journal of Applied Physics, Vol. 95, No. 5, March 2004.

These conditions cannot be obtained in a conventional oven, which generates too many leaks to enable such a low content to be achieved; the oven should be specially designed for optimal sealing (reduction in the number of parts in order to avoid joints, the use of solid parts . . . ).

On the other hand, an oxygen concentration in the atmosphere greater than 10 ppm stops dissolution and promotes oxidation of the exposed silicon.

In the case of SOI, the dissolution treatment is applied at a temperature of between 1,100 and 1,300° C., and preferably of the order of 1,200° C.

As a matter of fact, the higher the temperature, the higher the oxide dissolution rate. However, the treatment temperature should remain lower than the melting temperature of the silicon.

For example, in order to dissolve a thickness of oxide of 20 Å beneath a thin layer of silicon of 1,000 Å, the heat treatment conditions are: 1,100° C. for 2 hours, 1,200° C. for 10 minutes, or 1,250° C. for 4 minutes. However, it is emphasized that these values are in particular dependent upon the residual concentration of oxygen in the dissolution oven. Thus, more significant dissolved thicknesses have also been observed.

Formation of the Mask

As mentioned above, the mask is selectively formed on the semiconductor layer so as to leave exposed those areas of the semiconductor layer which correspond to the areas of the oxide layer in which it is desired to reduce the oxide thickness.

In this case, by "corresponding," is understood to mean that the pattern defined by all of the exposed areas of the semiconductor layer is identical to the desired pattern in which are arranged those areas of the oxide layer wherein it is desired to reduce the oxide thickness.

In other words, the mask covers only those areas of the semiconductor layer that are complementary to said desired pattern.

To that end, the mask is generally formed selectively, by using conventional photolithographic techniques which make it possible to define the areas of the semiconductor layer on which the mask is to be deposited.

The mask-formation process typically includes the following successive steps:

Formation, via deposition, of a silicon nitride $Si_xN_y$ layer (e.g., $Si_3N_4$), which is capable of comprising the mask, over the entire surface of the semiconductor layer;

Deposit of a photosensitive resin layer over the entire surface of the $Si_xN_y$ layer;

Localized exposure of the resin through a photolithographic mask;

Selective elimination of the exposed areas, via dilution in a solvent, for example;

Next, etching, through the openings formed in the resin, of the areas of the $Si_xN_y$ layer then exposed. The etching is typically a dry etching (plasma) process to which the resin is resistant. On the other hand, the $Si_xN_y$ is etched by this plasma.

The mask is made of material forming a barrier to the diffusion of oxygen atoms.

It is also of a type which withstands the treatment conditions.

Thus, silicon nitride (having the generic formula $Si_xN_y$ wherein the pair of stoichiometric coefficients (x, y) can assume various values) is a preferred material for forming the mask, because it is easy to implement (i.e., to deposit, and to then remove after the dissolution treatment), and does not contaminate the silicon.

However, any other material forming a barrier to oxygen diffusion and withstanding the treatment conditions can be used for the mask.

The mask typically has a thickness of between 1 and 50 nm, and preferably of the order of 20 nm.

After the dissolution treatment, the mask can be removed by dry or wet etching.

Generally speaking, the invention proposes to decrease the difference in level due to subsistence, by at least partially burying the mask in the thickness of the semiconductor layer.

In this case, the term “bury” is understood to mean that the base of the mask (i.e., the face opposite the free surface, which is in contact with the material of the semiconductor layer) is situated in the thickness of the material of the semiconductor layer. In other words, the level of the base of the mask is lower than the level of the surface of the exposed areas of the semiconductor layer.

The invention considers the case wherein the mask is partially buried, i.e., the free surface (or upper surface) thereof is at a higher level than that of the exposed surface of the semiconductor layer, as well as the case wherein the upper surface of the mask is at the same level as the exposed surface of the semiconductor layer, the mask then being referred to as “buried”.

According to a first embodiment of the invention, which is shown in FIGS. 2A to 2D, the $Si_xN_y$ mask is formed via a process of selectively nitriding the areas of the silicon layer intended to be covered by the mask.

Figure 2A:
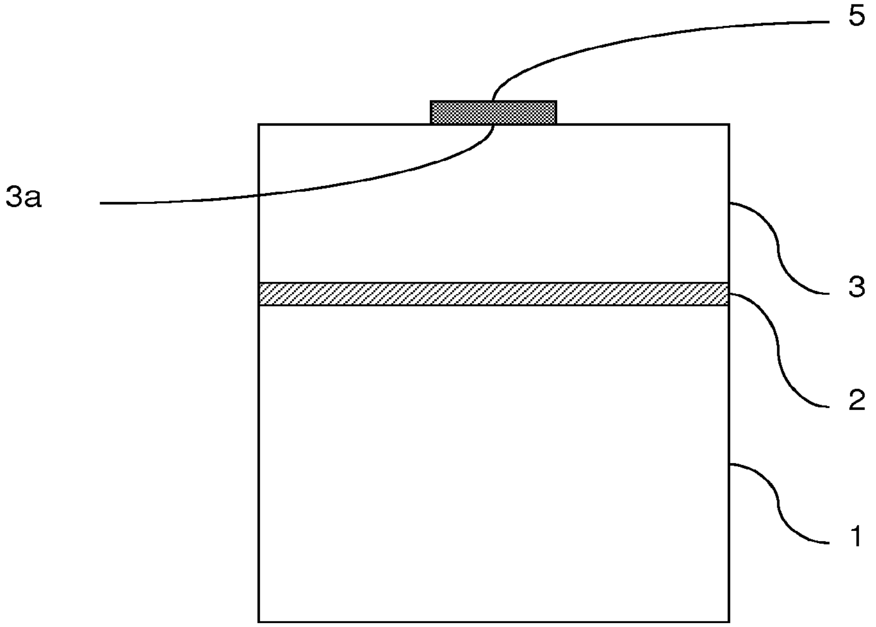
FIGS. 2A to 2D show the steps of a first embodiment of the invention.

To that end, and with reference to FIG. 2A, the areas 3*a* of the silicon layer 3 intended to be exposed to the atmosphere are protected from the dissolution heat treatment.

In this regard, photolithographic steps well-known to those skilled in the art are implemented, which comprise deposition of a photosensitive resin, exposure of the resin through a mask in order to polymerize the desired areas, and then etching in order to remove the unpolymerized resin, so as to cover only areas 3*a* with a protective resin 5.

Next, a nitriding treatment of the structure is carried out: since areas 3*a* are protected by the protective resin 5, only the complementary unprotected areas undergo the nitriding treatment.

Figure 2B:
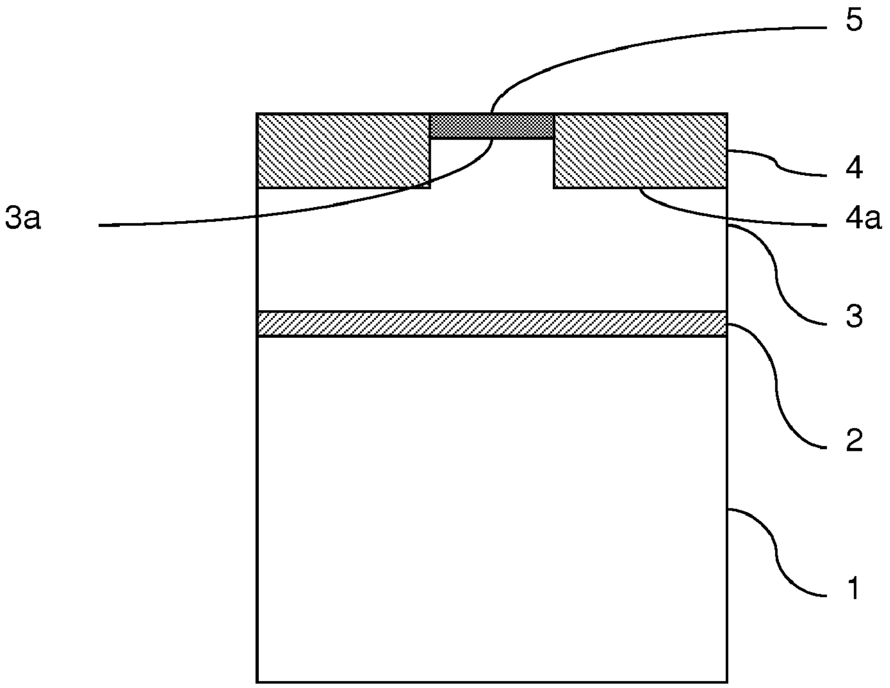

Contrary to the above-described conventional mask-forming process, nitriding has the effect of consuming a portion of the material of the silicon layer 3, such that the base 4*a* of the mask 4 (i.e., the face thereof which is opposite the free surface of same) is situated at a lower level than that of the free surface of the exposed area 3*a* of the silicon layer, as shown in FIG. 2B.

Thus, the more a thick layer 4 of $Si_xN_y$ is formed, the more the base 4*a* of this layer is driven into the thickness of the silicon layer 3.

In a particularly advantageous manner, the parameters of the nitriding process are adjusted such that the thickness of the buried portion of the mask is substantially equal to 1.5 times the thickness of the oxide layer 2.

Thus, a lower (buried) portion of the thickness of the mask 4 is situated below the level of the free surface of the exposed area 3*a*, whereas an upper portion is situated above.

Figure 2C:
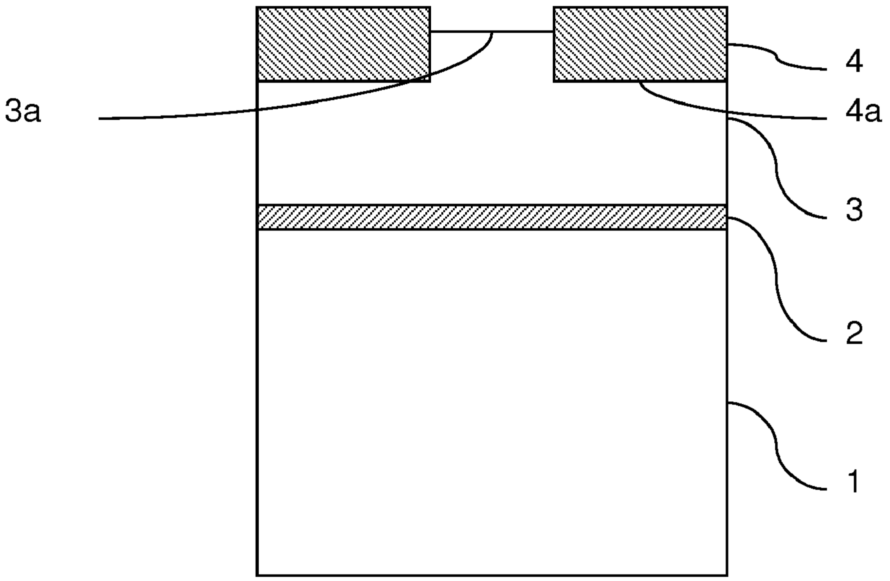

In reference to FIG. 2C, after forming the mask 4, the protective resin 5 is removed so as to expose areas 3*a*.

Next, the dissolution is carried out under the above-described conditions.

Figure 2D:
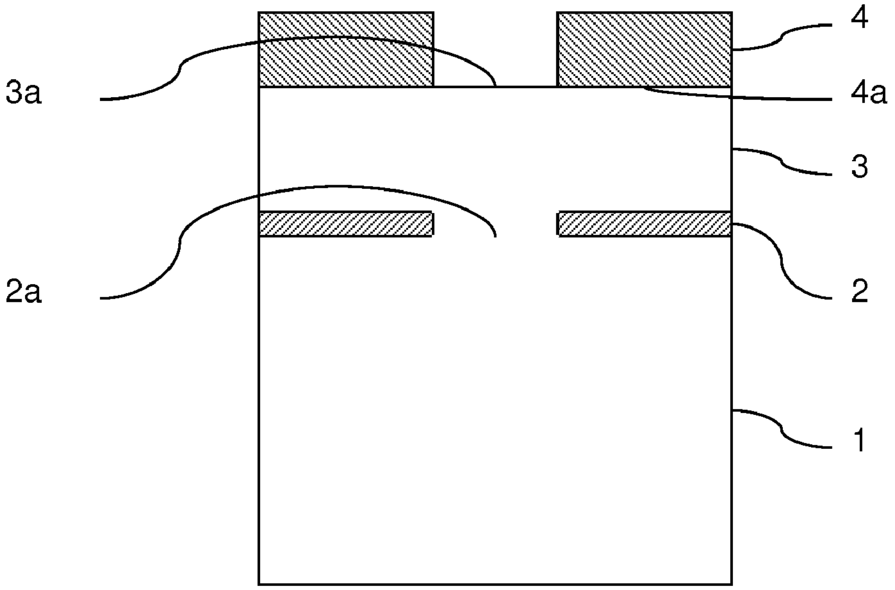

Upon completion of the dissolution treatment, the level of the free surface of the exposed area 3*a* has decreased of the order of 1.5 times the initial thickness of the oxide layer 2. The resulting structure is shown in FIG. 2D.

The free surface of the exposed area 3*a* is therefore situated at substantially the same level as that of the areas covered by the mask.

Therefore, no subsistence of the surface of the semiconductor layer is observed.

Therefore, a topography is obtained, which is more favourable to the formation of components, since the final silicon layer has a substantially planar surface.

As an advantageous alternative to nitriding, the mask 4 can be formed by applying to the semiconductor structure covered by the protective resin 5 (as shown on FIG. 2A) a nitrogen plasma treatment.

Such a plasma treatment results in the formation, when the structure is brought back to ambient atmosphere, of a mask made of silicon oxinitride (of general formula SiON, wherein stoichiometric coefficients can vary).

This plasma treatment has two main effects.

The first one is to etch the surface of the semiconductor layer, thereby forming a trench in this layer. According to the duration and the intensity of the plasma treatment, it is thus possible to form a trench having a depth of 5 to 20 nm.

The second effect of the plasma treatment is to modify the nature of the upper region of the semiconductor layer in the exposed areas on a thickness of about 5 to 10 nm, thereby forming the SiON mask.

This treatment thus constitutes a very simple way of forming the mask.

Before said nitrogen plasma treatment, one can perform a more aggressive plasma (by adjusting intensity and duration) treatment in order to etch deeper trenches if required.

In addition to its easy implementing, the nitrogen plasma treatment allows forming thin (i.e. a few nanometres, e.g. 5 nm) buried masks which result in favourable topographies after dissolution.

Example Associated with this First Embodiment

The starting point is an SOI structure which, from the base to the surface thereof, comprises a substrate, a 10-nm thick oxide layer and a thin 70-nm thick silicon layer.

Resin patterns are formed on the thin silicon layer so as to protect the areas intended to be exposed to the atmosphere of the dissolution heat treatment.

Next, an anneal is carried out at a temperature of between 700 and 1,000° C., under a nitrogen atmosphere, so as to form the $Si_xN_y$ mask on the areas of the silicon layer not covered by the resin.

After removing the protective resin, a mask of $Si_xN_y$ is obtained, having a total thickness of 30 nm, which is partially buried in the silicon.

Otherwise, a nitrogen plasma treatment is carried out in order to form the SiON mask of a thickness of about 5 nm on the areas of the silicon layer not covered by the resin.

The above-described dissolution treatment is then applied, at 1,200° C. for 1 hour, in order to dissolve the entire thickness of the oxide layer in the areas corresponding to the exposed areas of the silicon layer.

According to a second embodiment, which is shown in FIGS. 3A to 3D, the areas 3*a* intended to be exposed during the local dissolution treatment are protected by means of a protective resin 5. To that end, a photolithographic technique well-known to those skilled in the art is implemented, as described above.

Figure 3A:
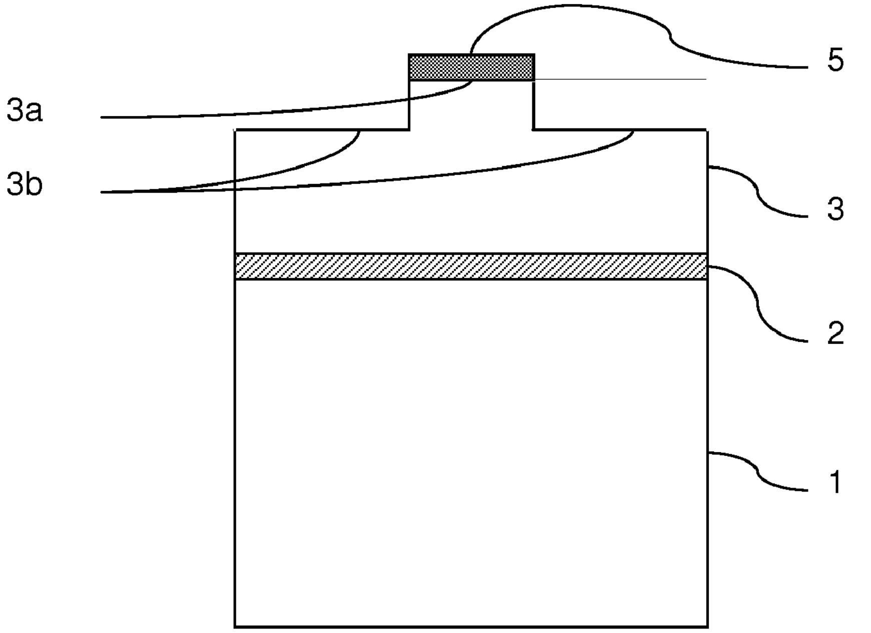
FIGS. 3A to 3D show the steps of a second embodiment of the invention.

Referring to FIG. 3A, the unprotected regions of the surface of the silicon layer 3 are next etched so as to form trenches 3*b* of a specific depth. To that end, for example, dry etching is carried out, such as plasma etching.

Figure 3B:
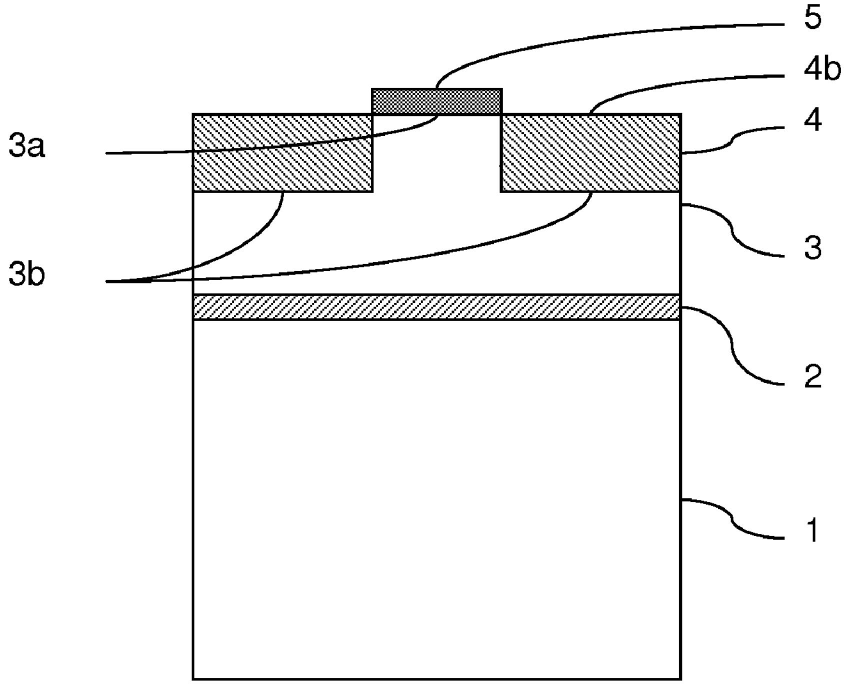

Referring to FIG. 3B, a nitriding treatment similar to that described in the first embodiment is carried out.

The effect of the nitriding is to form an $Si_xN_y$ mask in the trenches 3*b*, while likewise consuming a portion of the silicon of layer 3.

By adapting the depth of the trenches 3*b* and the thickness of the mask 4*b* thus formed, it can be ensured that the upper surface 4*b* of the mask is flush with that of the areas 3*a* intended to be exposed during the dissolution treatment.

In a particularly advantageous manner, the depth of the trenches 3*b* is determined such that the thickness of the buried portion of the mask is of the order of 1.5 times the thickness of the oxide layer 2.

The exposed areas 3*a* of the silicon layer therefore have an added thickness of the order of 1.5 times the thickness of the oxide layer, in relation to the areas covered by the mask 4.

It can be noted that the steps of forming the trenches and forming the mask can be performed simultaneously by carrying out the nitrogen plasma treatment described above. In this case, the mask is made of silicon oxinitride.

Figure 3C:
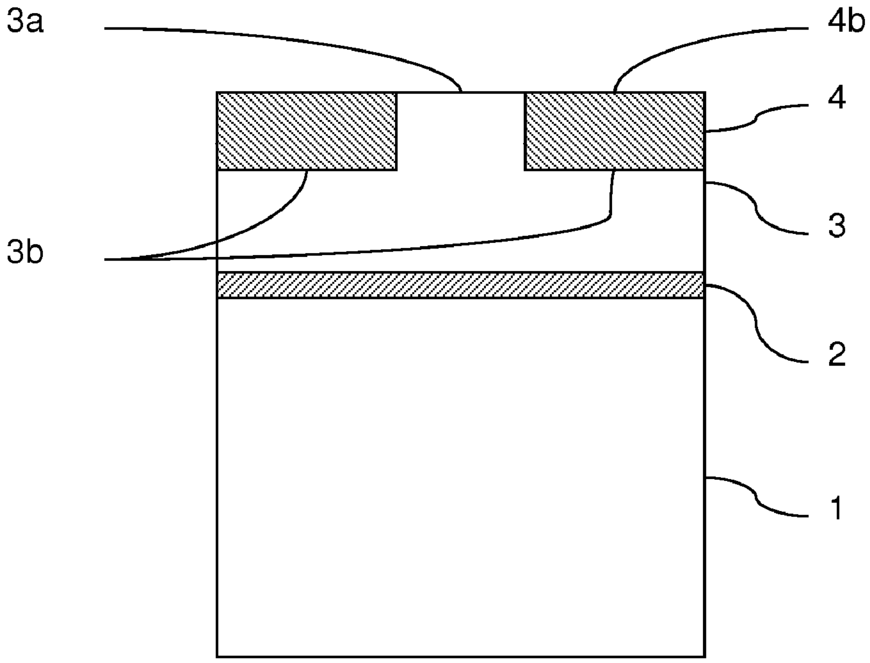

Referring to FIG. 3C, the protective resin 5 is removed prior to the dissolution treatment, so as to expose areas 3*a*.

Figure 3D:
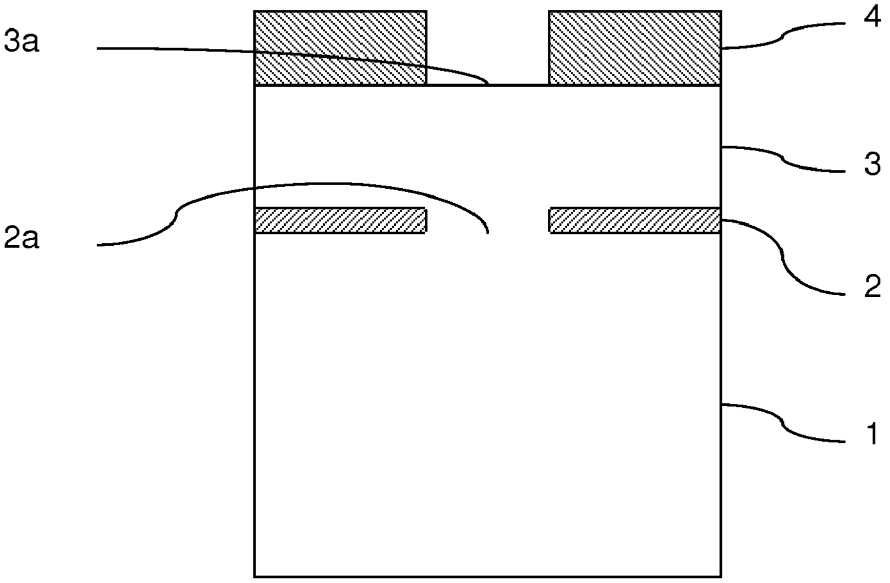

This initial added thickness thus compensates for the subsistence of the exposed areas following the local dissolution treatment, as can be seen in FIG. 3D.

Figure 4A:
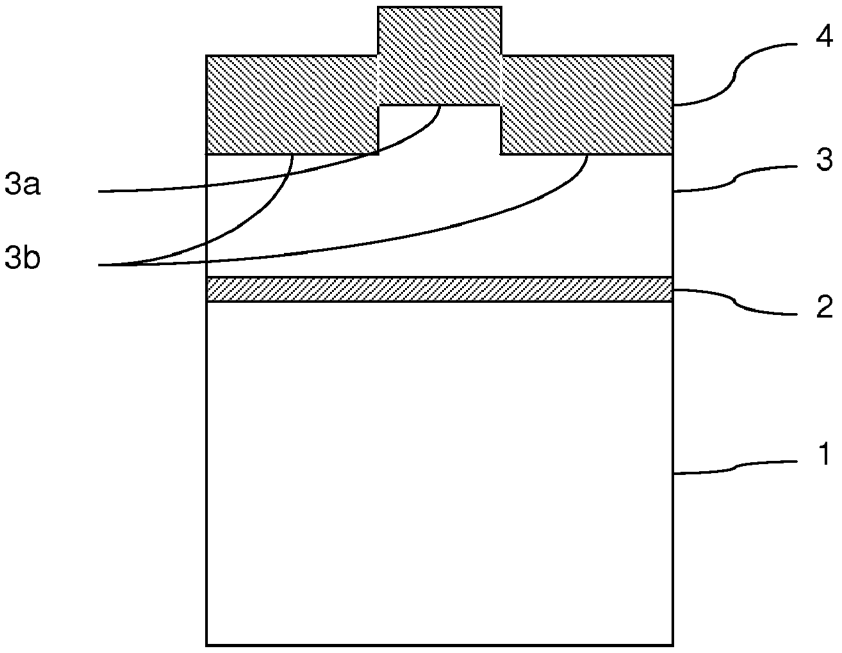
FIGS. 4A to 4B show an alternative of the second embodiment.
Figure 4B:
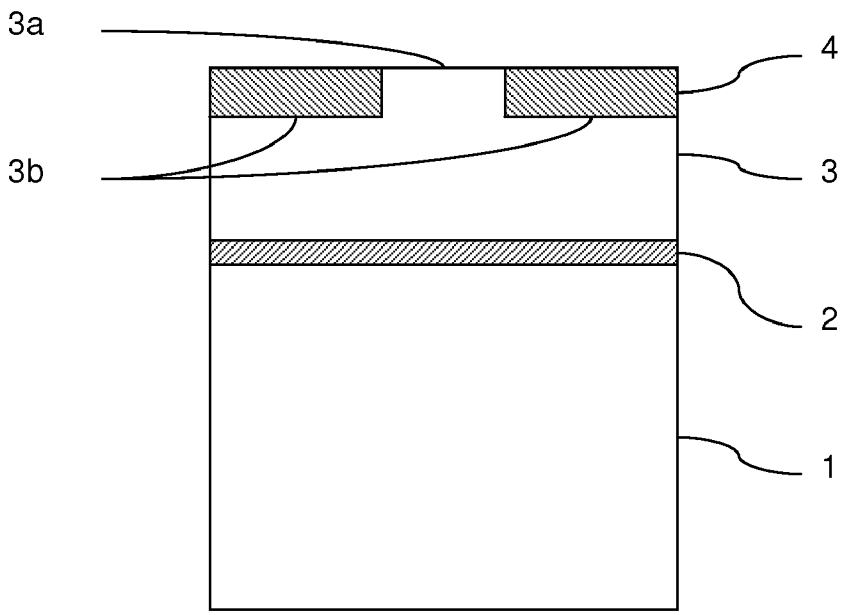

According to an alternative of the second embodiment, which is shown in FIGS. 4A and 4B, the following steps can be implemented successively.

As in the second embodiment, trenches 3*b* are formed after having protected the areas 3*a* of the semiconductor layer 3 intended to be exposed to the dissolution treatment (cf. FIG. 3A) with a protective resin.

Referring to FIG. 4A, said protective resin is next removed, and then silicon nitride is deposited over the entire surface of the SOI, i.e., both in the trenches 3*b* and on the areas 3*a* intended to be exposed: a structure is then obtained in which the profile of the surface of the silicon nitride deposited is parallel to that of the surface of the etched silicon layer 3. In particular, the trenches 3*b* are therefore filled with silicon nitride 4.

In a following step, which is shown in FIG. 4B, the surface of the silicon nitride is planarized by CMP (Chemical Mechanical Planarization) until reaching the upper surface of the areas 3*a* of the silicon layer intended to be exposed to the dissolution treatment.

The dissolution treatment can then be applied to the resulting structure.

Example Associated with this Alternative:

The starting point is an SOI structure which, from the base to the surface thereof, comprises a substrate, a 10-nm thick oxide layer and a thin 70-nm thick silicon layer.

Resin patterns are formed on the thin silicon layer so as to protect the areas intended to be exposed to the atmosphere of the dissolution heat treatment.

Trenches having a depth of 15 nm are formed by means of dry etching, in the areas not protected by the resin, and then the protective resin is removed.

$Si_xN_y$ is then deposited over the entire surface of the resulting structure, over a thickness greater than the depth of the trench.

Next, planarization of the silicon nitride is carried out via CMP.

The above-described dissolution treatment is then applied at 1,200° C. for 1 hour, in order to dissolve the entire thickness of the oxide layer in the areas corresponding to the exposed areas of the silicon layer.

According to an alternative to the nitriding treatment carried out in the first and second embodiment, the $Si_xN_y$ mask can be formed by means of low-energy nitrogen implantation in the silicon semiconductor layer.

Prior to implantation, the surface of the semiconductor layer is covered with a mask which is sufficiently thick to form an obstacle to the implantation of the nitrogen ions in the areas of the semiconductor layer where the mask is not intended to be formed.

The nitrogen ions implanted in the silicon matrix form $Si_xN_y$ at the surface of the semiconductor layer.

A person skilled in the art would be able to determine the implantation parameters (dosage, energy) in order to form the silicon nitride over the desired thickness for the mask.

What is claimed is:

1. A process for treating a semiconductor-on-insulator structure that includes, successively, a support substrate, an oxide layer and a thin semiconductor layer, which comprises:

forming a nitride mask on the thin semiconductor layer to define exposed areas at the surface which are not covered by the mask and which are arranged in a desired pattern, with the mask formed to be at least partially buried in the thickness of the thin semiconductor layer; and applying a heat treatment in a neutral or controlled reducing atmosphere and under controlled conditions of temperature and time to induce at least a portion of the oxygen of the oxide layer to diffuse through the thin semiconductor layer, thereby resulting in a controlled reduction of oxide thickness in the areas of the oxide layer corresponding to the desired pattern of the exposed areas.

2. The process of claim 1, wherein the mask involves consumption of at least a portion of the thickness of the semiconductor layer.

3. The process of claim 1, wherein the mask is formed of a silicon nitride or silicon oxynitride material by applying a nitrogen plasma treatment to the semiconductor layer.

4. The process of claim 1, wherein the mask is formed by implanting nitrogen at the surface of the semiconductor layer.

5. The process of claim 1, wherein the mask is formed by:

etching the thin semiconductor layer to form trenches at locations anticipated for the mask; and forming the mask in the trenches.

6. The process of claim 1, wherein the semiconductor layer is made of silicon and has a thickness smaller than 5,000 Å.

7. The process of claim 1, wherein the semiconductor layer is made of silicon and has a thickness smaller than 2,500 Å.

8. The process of claim 3, wherein the mask is formed by nitriding the material of the semiconductor layer, thereby resulting in consumption of a portion of the thickness of the semiconductor layer.

9. The process of claim 8, wherein the thickness of the portion of the mask contained between the base of the mask and the free surface of the exposed areas is chosen to be substantially equal to 1.5 times the thickness of the oxide layer of the structure.

10. The process of claim 8, wherein the thickness of the mask is between 1 and 50 nm and the nitriding step is carried out by annealing the structure in a nitrogen atmosphere at a temperature of between 700 and 1,000° C.

11. The process of claim 5, wherein the trenches have a depth substantially equal to 1.5 times the thickness of the oxide layer of the structure.

12. The process of claim 5, wherein the mask is formed such that the surface thereof is flush with the surface of the exposed areas of the semiconductor layer.

13. The process of claim 5, wherein the thickness of the mask is between 1 and 50 nm and the forming of the mask includes nitrogen plasma treatment or nitriding of the trenches or nitrogen implantation at the surface of the semiconductor material of the trenches.

14. The process of claim 5, wherein the mask is formed by:

depositing silicon nitride on the etched structure and at a thickness that is greater than the depth of the trenches; and planarizing the deposited silicon nitride until reaching the exposed areas of the semiconductor layer.

* * * * *